United States Patent
Treichler et al.

(10) Patent No.: US 8,249,819 B1
(45) Date of Patent: Aug. 21, 2012

(54) VIRTUAL BINNING

(75) Inventors: Sean Jeffrey Treichler, Sunnyvale, CA (US); Brian M. Kelleher, Palo Alto, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1614 days.

(21) Appl. No.: 11/612,835

(22) Filed: Dec. 19, 2006

(51) Int. Cl.
*G01R 15/00* (2006.01)
(52) U.S. Cl. .................................................. 702/57
(58) Field of Classification Search .......... 702/57, 702/118
See application file for complete search history.

(56) References Cited

U.S. PATENT DOCUMENTS

| | | | | |
|---|---|---|---|---|
| 6,731,158 | B1 * | 5/2004 | Hass | 327/537 |
| 6,943,613 | B2 * | 9/2005 | Miyazaki et al. | 327/534 |
| 7,475,366 | B2 * | 1/2009 | Kuemerle et al. | 716/134 |
| 7,715,937 | B2 * | 5/2010 | Clougherty et al. | 700/108 |
| 7,835,881 | B1 * | 11/2010 | Zverev et al. | 702/118 |

* cited by examiner

*Primary Examiner* — Mohamed Charioui
*Assistant Examiner* — Alexander Satanovsky
(74) *Attorney, Agent, or Firm* — Kilpatrick Townsend & Stockton LLP (57) ABSTRACT

An electronic device is assigned to a virtual bin by setting an operating voltage of the electronic device to a first voltage, determining an operating frequency and an operating power consumption level for the electronic device, determining an operating frequency differential equal to the absolute value of difference between the operating frequency and a minimum operating frequency of the physical bin, determining a power consumption level differential equal to the absolute value of difference between the operating power consumption level and a maximum operating power consumption level of the physical bin, and assigning a virtual bin identifier to the electronic device to identify the operating voltage of the electronic device if the operating frequency is greater than or equal to the minimum operating frequency of the physical bin and the operating power consumption level is less than or equal to the maximum power consumption level of the physical bin.

15 Claims, 7 Drawing Sheets

VIRTUAL BINNING

BACKGROUND OF THE INVENTION

The present invention relates generally to integrated circuit production and in particular to increasing production yield of integrated circuit devices.

Manufacturers use a physical binning technique to segregate products coming off of a production line into distinct groupings or bins based upon the performance characteristics of the electronic devices. Higher performing devices, and thus those that can be sold for higher price, are segregated from the lower performing, and thus less expensive, devices by placing them in separate physical bins.

One physical binning technique used by manufacturers is speed binning. Some devices coming off of the manufacturing line will be capable of operating at a higher clock speed than other devices due to slight variations in manufacturing. Devices capable of running at a faster clock speed are placed in a separate physical bin from devices that run at a slower clock speed. A manufacturer can produce a complete product line from a high-end faster model to a low-end slower model by sorting electronic devices from the same production line into separate product lines based upon the performance of the devices.

BRIEF SUMMARY OF THE INVENTION

Virtual binning is a process for characterizing electronic devices in a production manufacturing setting in order to boost the effective yield of electronic devices that operate within a specified performance and frequency envelope. Physical binning of electronic devices involves the segregation of electronic devices into separate physical bins based upon the performance of an electronic device. For example, a manufacturer producing graphics processor units (GPUs) might segregate the product into three physical bins based upon clock speed of the devices coming off of the production line: 450 megahertz, 500 megahertz, and 550 megahertz. Each GPU coming off of the production line would be tested at a fixed voltage in order to determine the maximum operating speed of the GPU. The GPU would then be placed in the appropriate bin based upon its maximum operating speed. GPUs with a maximum operating speed less than 450 megahertz may be placed in a discard bin or, may in some instances be used in a system with a performance and frequency envelope that allows for the use of slower devices. The GPUs which were placed in the 450 megahertz, the 500 megahertz, and the 550 megahertz may then be marketed as separate products in a product line, with the faster devices being a higher-end product and the slower devices being a less-expensive lower-end product.

An advantage of virtual binning is that virtual binning may be used to enlarge a physical bin by dividing a physical bin into one or more virtual bins, and thus, reduce the number of physical bins associated with the production of an electronic device. Virtual binning may increase the yield in a particular physical bin by adjusting, for example, the operating voltage of an electronic device. Electronic devices are tested and assigned to a virtual bins with parameters that enable the electronic device to operate within the operating frequency and power consumption limits defined for the physical bin. In an embodiment, each virtual bin represents an operating voltage at which each of the electronic devices assigned to the virtual bin perform within the specified performance and frequency envelope of the physical bin (within a specified margin). Each electronic device is assigned a virtual bin identifier of a virtual bin associated with an operating voltage, and the virtual bin number is encoded onto the electronic device. The virtual bin number can later be used in conjunction with software to determine an operating voltage for an electronic device that will allow the electronic device to run at a specified operating frequency (within a predefined margin) for the physical bin.

Advantageously, virtual binning exposes a single part number or bin number corresponding to the physical bin to the consumer public. Consumers need not be aware of or concerned with the virtual binning information assigned to the electronic device, and can order the electronic device using the physical bin number. The performance of the electronic device, regardless of the virtual bin into which the product falls, will be functionally indistinguishable from a customer's point of view because chips within the physical bin are setup to have the same maximum power consumption and the same minimum speed.

In an embodiment of the present invention, a method for virtual binning is provided in which an operating voltage is determined that allows an electronic device to operate within a set of operating parameters for a physical bin. The method includes the steps of setting an operating voltage of the electronic device to a first voltage. After setting the electronic device to the first voltage, an operating frequency and an operating power consumption level of the electronic device is determined. An operating frequency differential is then determined. The operating frequency differential represents the difference between the operating frequency and a minimum operating frequency for the physical bin. A power consumption level differential is also determined. The power consumption differential represents the difference between the operating power consumption level and a maximum operating power consumption level for the physical bin. Additionally, if the operating frequency is greater than or equal to the minimum operating frequency of the physical bin and the operating power consumption level is less than or equal to the maximum power consumption level of the physical bin, a virtual bin identifier is assigned to the electronic device to identify the operating voltage of the electronic device.

In another embodiment of the present invention, a method for virtual binning is using a set of virtual bins associated with a physical bin is provided. The method includes the iteratively performing the following steps for each virtual bin in a set of virtual bins associated with a physical bin to determine a virtual bin identifier for the electronic device. A virtual bin is selected from a set of virtual bins associated with a physical bin. The virtual bin includes a virtual bin identifier and a operating voltage at which devices in the virtual bin should operate within the operating parameters for the physical bin. An operating voltage of the electronic device is set to the operating voltage of the selected virtual bin. An operating frequency and an operating power consumption level are determined for the electronic device once the operating voltage of the electronic device is set. An operating frequency differential is determined for the current operating voltage of the electronic device. The operating frequency differential represents the absolute value of difference between the operating frequency and a minimum operating frequency for the physical bin. A power consumption level differential is also determined. The power consumption differential represents the difference between the operating power consumption level and a maximum operating power consumption level for the physical bin. Additionally, if the power consumption differential is less than a power consumption differential threshold of the physical bin and the operating frequency differential is less than a operating frequency differential threshold for the physical bin, the virtual bin identifier of the selected virtual bin is assigned to the electronic device. The iteration through the set of virtual bins associated with the physical bin is stopped if a virtual bin identifier is assigned to the electronic device.

In yet another embodiment, a system for utilizing a virtually-binned electronic device is provided. The system comprises an electronic device comprising a virtual bin identifier identifying a virtual bin to which the electronic device has been assigned from a set of virtual bins associated with a physical bin. The system also comprises an integrated circuit board to which the virtually-binned electronic device is coupled. The system further comprises software code adapted to read the virtual bin identifier from the electronic device in order to determine a set one or more of operating parameters for the electronic device. The software code also includes logic to configure the integrated circuit board to provide the set of operating parameters for the electronic device.

Other features and advantages of the invention will be apparent in view of the following detailed description and preferred embodiments.

DETAILED DESCRIPTION OF THE INVENTION

Embodiments of the invention are described here, with reference to the figures. Where elements of the figures are called out with reference numbers, it should be understood that like reference numbers refer to like elements and might or might not be the same instance of the element.

Electronic devices, such as microprocessors, are subject to manufacturing variations that affect the operating characteristics of the electronic devices. These variations may be significant enough that electronic devices coming from the same manufacturing process cannot be used interchangeably, and instead must be sorted into separate physical bins comprising subsets of electronic devices whose operating characteristics fall within a predefined set of operating parameters for each physical bin. Virtual binning provides a method and system for individually adjusting operating parameters of electronic devices, such as operating voltage and/or back bias voltage, such that the individual operating characteristics of the electronic devices to fall within a predefined set of operating parameters for a physical bin. Consequently, the number of physical bins required for a particular manufacturing process may be decreased, and manufacturers may obtain a higher yield in an target physical bin that has an optimal set of operating characteristics for the electronic devices being produced.

Virtual binning may be used to adjust the operating parameters of electronic devices such as central processing units (CPUs) or graphics processing units (GPUs) coming off of a manufacturing production line. Non-volatile virtual bin data is programmed onto each virtually binned electronic device to identify a set of optimal operating parameters for which the device will perform within the operating parameters of a physical bin. For example, in an embodiment, a GPU is tested to determine a virtual bin information for the GPU. The virtual bin information is then programmed into the GPU by programming a set of fuses included in the GPU.

GPUs, CPUs and other electronic devices embodying aspects of the present invention may be incorporated into a variety of devices, including general purpose computer systems, video game consoles and other special purpose computer systems, DVD players, handheld devices such as mobile phones or personal digital assistants, and so on.

Figure 1:
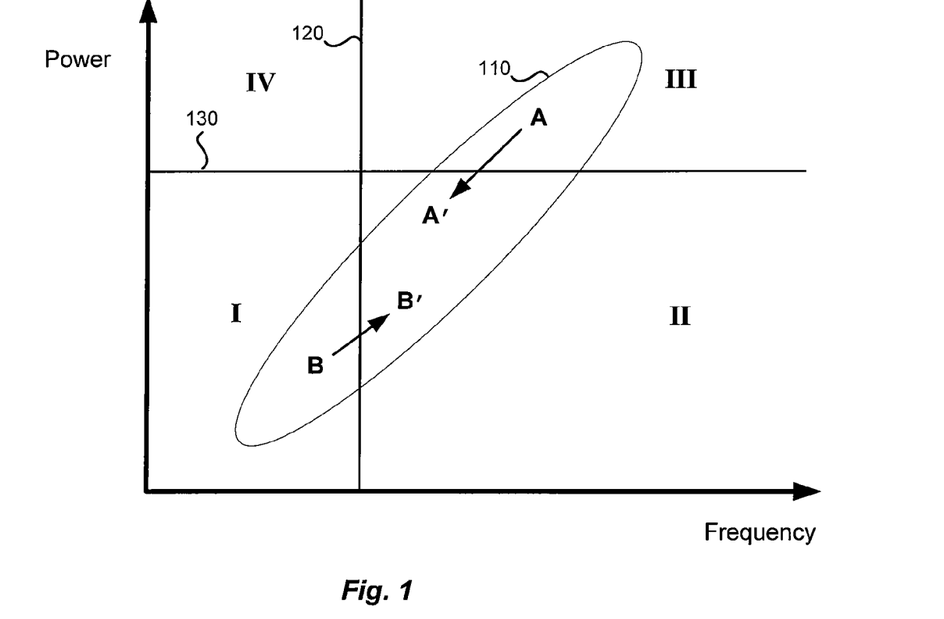
FIG. 1 is a plot of an exemplary electronic device implementing virtual binning to enabling the electronic device to determine an operating voltage to provide to a chip according to one embodiment of the present invention.

FIG. 1 illustrates an exemplary distribution of electronic devices plotted by operating frequency versus power consumption level according to one embodiment of the present invention. Elliptical region 110 represents an area comprising an area encompassing a distribution of points representing the frequency and power associated with a representative sampling of electronic components from a production line.

Line 120 represents a minimum operating frequency at which a device must operate in order for the device to be able to be included in a physical bin. Devices with an operating frequency less than the minimum operating frequency run too slowly to be included in the physical bin. Line 130 represents a maximum power consumption level for a device to fall within the physical bin. Devices which exceed the maximum power consumption level may be too leaky, and thus require additional power in order to run at an operating frequency greater than the minimum operating frequency. The maximum power consumption level of an electronic device is important not only for the purposes of supplying power to the device, but is also important consideration for the purposes of cooling hardware, since higher power consumption produces larger amounts of heat that must be dissipated from the device.

Line 120 and line 130 segment the operating frequency and power plot to four quadrants. Quadrant I represents a virtual bin where electronic devices associated with the virtual bin have an operating frequency less than minimum operating frequency 120 for the physical bin. Devices in quadrant I run too slow to be included in the physical bin at a specific operating voltage for the physical bin, but the quadrant I devices also have a power consumption level less than or equal to maximum power consumption level 130. Quadrant II represents a virtual bin where the electronic devices associated with the bin operate within the operating frequency and power consumption limits of the physical bin. The operating frequency of a device in quadrant II is greater than or equal to minimum operating frequency 120 and the power consumption level of the device is less than or equal to maximum power consumption level 130 for the physical bin. Quadrant III represents a virtual bin where electronic devices associated with the bin have an operating frequency greater than minimum operating frequency 120, but have an operating power consumption level that exceed maximum power consumption level 130 associated with the physical bin. The electronic devices whose performance falls within quadrant III operate at sufficiently fast operating frequency, but are too leaky and consume more power than a less leaky chip would require in order to operate at the same frequency. Quadrant IV represents a "discard" bin where the electronic devices associated with the bin are both too slow and too leaky. The operating frequency of the devices in quadrant IV are less than minimum operating frequency 120, and the operating power consumption level of the devices in quadrant IV exceed maximum operating power consumption level 130. Devices in quadrant IV operate outside of the frequency and power consumption envelope of the physical bin to be included in the physical bin. Virtual binning generally cannot bring devices from quadrant IV into quadrant II on the plot, because the quadrant IV devices operate so far outside of the performance and frequency envelope for the physical bin.

Figure 2:
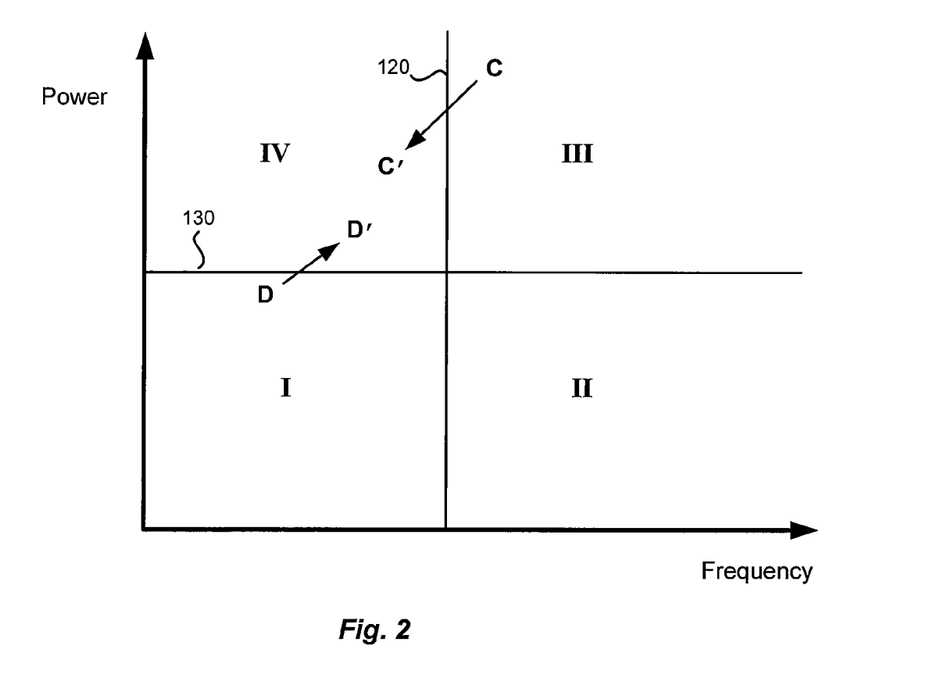
FIG. 2 is a plot of a process distribution which illustrates an exemplary distribution of electronic devices according to one embodiment of the present invention.

In an embodiment, virtual binning allows an electronic device in quadrant III that would otherwise be too power hungry (exceeding maximum power consumption level 130) to be operated at a lower voltage in order to bring the power consumption level of the electronic device below or equal to maximum power consumption level 130. However, as a consequence of using a lower operating voltage, the device will also have a lower operating frequency. For devices operating at a sufficiently high margin over minimum operating frequency level 120, decreasing the operating voltage to bring power consumption of the electronic devices below or equal to maximum power consumption level 130 will not cause the operating frequency of the electronic device to fall below minimum operating frequency 120. For example, a device is tested that has a operating frequency and power consumption level A for a specified operating voltage which is above maximum power consumption level 130 for the physical bin. By decreasing the operating voltage of the device, both the power consumption level and the operating frequency of the device decrease to A'. Accordingly, the electronic device now operates within the power consumption and operating frequency envelope of the physical bin. However, in some instances, lowering the operating voltage of the electronic device in order to decrease the power consumption of the device would cause the operating frequency of the device to drop below minimum operating frequency 120 for the physical bin. For example, in FIG. 2, a device is tested that has an operating frequency and power consumption level C that exceeds maximum power consumption level 130, but is also close to minimum operating frequency level 120. If the operating voltage of the electronic device is decreased in order to lower the power consumption level of the device below maximum power consumption level 130, the operating frequency of the device will decrease below minimum operating frequency level 120. Therefore, virtual binning will not be able to be used to adjust the operating parameters of the device in order to bring the device in the physical bin.

Virtual binning also allows components in quadrant I that would otherwise be too slow (operating frequency less than minimum operating frequency level 120) to be operated at a higher voltage in order to bring the operating frequency level above or equal to minimum operating frequency level 120. As a consequence of utilizing a higher operating voltage, the device will also have a higher power consumption level. For devices that operating at a sufficiently low margin under maximum operating power consumption level 130, the increase in operating voltage sufficient to bring the operating frequency above or equal to minimum operating frequency 120 will still allow the device to maintain a power consumption level less than or equal to maximum operating frequency 130. For example, a device is tested that has a operating frequency and power consumption level B for a specified operating voltage which is below minimum operating frequency level 120 for the physical bin. By increasing the operating voltage of the device, both the power consumption level and the operating frequency of the device increase to B'. Accordingly, the device now operates within the power consumption and operating frequency envelope of the physical bin. However, in some instances it may not be possible to increase the operating voltage of the device in order to increase the operating frequency of the device, because the power consumption of the device would increase above maximum power consumption level 130 for the physical bin. For example, in FIG. 2, a device is tested that has an operating frequency and power consumption level D that is less than minimum operating frequency level 120, but is also close to maximum power consumption level 130. If the operating voltage of the electronic device is increased in order to raise the operating frequency of the device above or equal to minimum operating frequency level 130, the power consumption level of the device will increase above maximum power consumption level 130. Therefore, virtual binning will not be able to be used to bring the device into the physical bin.

Figure 3:
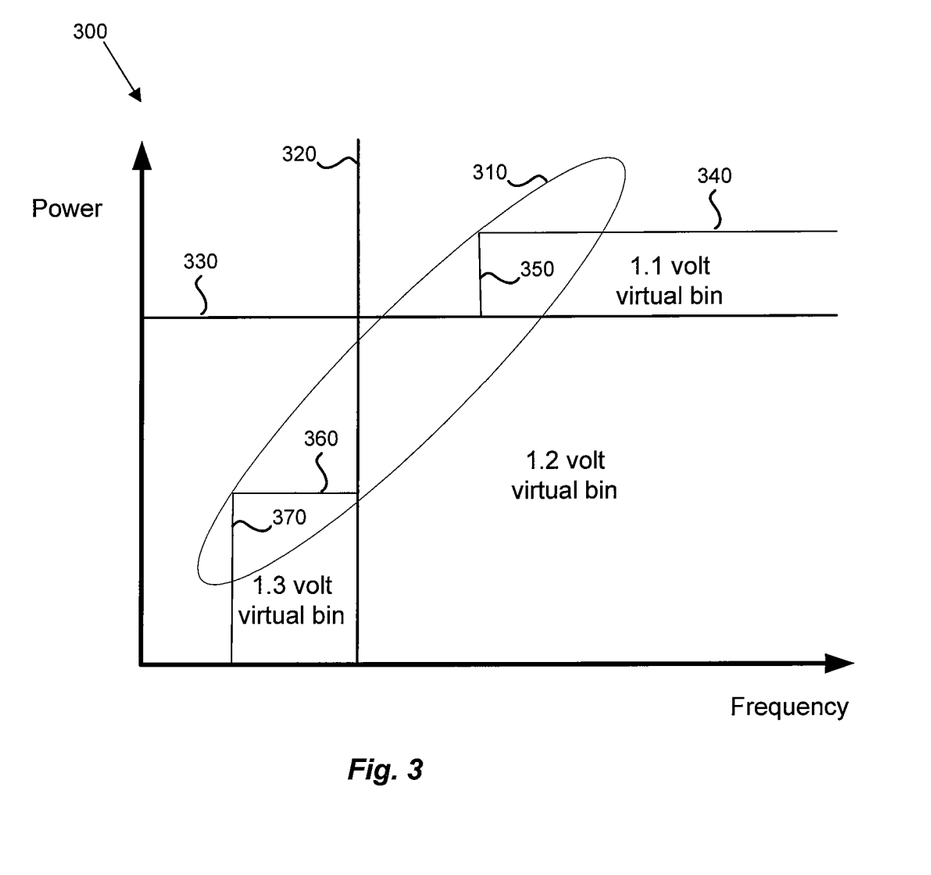
FIG. 3 is a plot of a process distribution according to an embodiment of the present invention illustrating the use of multiple virtual bins to attempt to capture a large portion of the process distribution into a single physical bin according to one embodiment of the present invention.

FIG. 3 illustrates a physical bin comprising three virtual bins with different operating voltages that enable devices associated with each of the virtual bins to operate within the operating frequency and power consumption requirements of the physical bin according to one embodiment of the present invention. Elliptical region 310 represents an area comprising an area encompassing a distribution of points representing the frequency and power associated with a representative sampling of electronic components from a production line.

Line 320 represents a minimum operating frequency at which a device must operate in order for the device to be able to be included in a physical bin at an operating voltage of 1.2 volts. Devices with an operating frequency less than the minimum operating frequency run too slow to be included in the physical bin. Line 330 represents a maximum power consumption level for a device to fall within the physical bin at an operating voltage of 1.2 volts. Devices which exceed the maximum power consumption level may be too leaky, and require additional power in order to run at an operating frequency greater than the minimum operating frequency. The region bounded by maximum power consumption level 330 and by minimum operating frequency 320, represents a 1.2 volt virtual bin. The 1.2 volt virtual bin includes devices that operate within the power consumption and operating frequency requirements of the physical bin when the devices are provided a 1.2 volt operating voltage.

Line 370 represents a minimum operating frequency at which a device must operate in order for the device to be able to be included in a physical bin at an operating voltage of 1.3 volts. Line 360 represents a maximum power consumption level for a device to fall within the physical bin at an operating voltage of 1.3 volts. The region bounded by maximum power consumption level 360, by minimum operating frequency 370, and by minimum operating frequency 320 of the 1.2 volt bin, represents a 1.3 volt virtual bin. The 1.3 volt virtual bin includes devices that operate within the power consumption and operating frequency requirements of the physical bin when the devices are provided a 1.3 volt operating voltage. The devices in the 1.3 volt bin would run too slow at 1.2 volts to be included in the physical bin. However, by operating the devices in the 1.3 volt bin at a higher operating voltage, the operating frequency of the devices in the 1.3 volt bin increases sufficiently to enable the devices to be included in the same physical bin as the devices in the 1.2 volt bin.

Line 350 represents a minimum operating frequency at which a device must operate in order for the device to be able to be included in a physical bin at an operating voltage of 1.1 volts. Line 340 represents a maximum power consumption level for a device to fall within the physical bin at an operating voltage of 1.1 volts. The region bounded by maximum power consumption level 340, by minimum operating frequency 350, and by maximum power consumption level 330 for the 1.2 volt bin, represents a 1.1 volt virtual bin. The 1.1 volt virtual bin includes devices that operate within the power consumption and operating frequency requirements of the physical bin when the devices are provided a 1.1 volt operating voltage. The devices in the 1.1 volt bin would be too leaky at 1.2 volts and the power consumption levels of the devices would exceed maximum power consumption level 330 for the devices to be included in the physical bin. However, by operating the devices in the 1.1 volt bin at a lower operating voltage, the power consumption level of the devices in the 1.1 volt bin decreases sufficiently to enable the devices to be included in the same physical bin as the devices in the 1.1 volt bin while the operating frequency of the device remains above minimum operating frequency for the physical bin.

Figure 4:
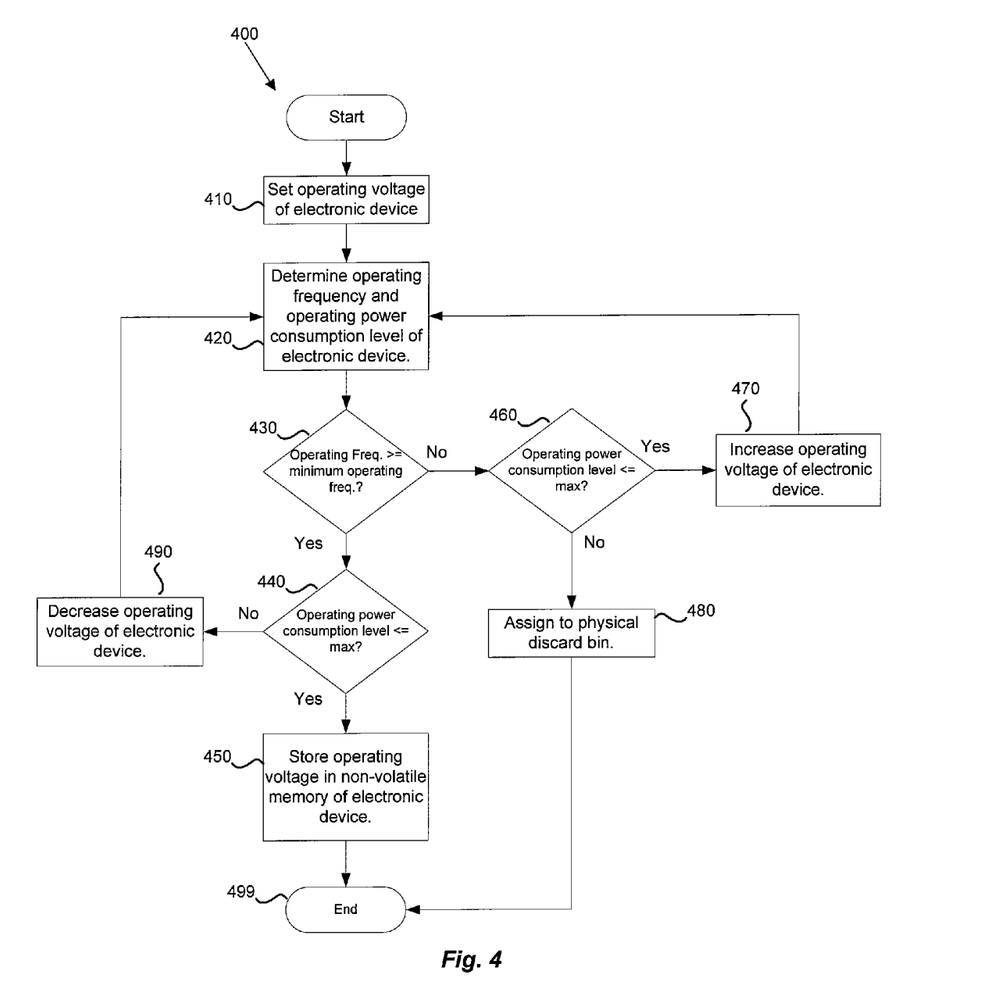
FIG. 4 is a flow diagram of a process for virtual binning of an electronic device where an operating voltage specific to the electronic device is determined that will allow the electronic device to operate within the operating parameters of a physical bin according to one embodiment of the present invention.

FIG. 4 is a flow diagram of a process for virtual binning of an electronic device where an operating voltage specific to the electronic device is determined that will allow the electronic device to operate within the operating parameters of a physical bin according to one embodiment of the present invention. The process begins with step 410, the system sets an operating voltage of the electronic device to an operating voltage associated with a physical bin. For example, a physical bin may have an associated operating voltage of 1.5 volts which enables an electronic device assigned to the physical bin to operate at a specified frequency and power consumption level. In step 420, an operating frequency and operating power consumption level of the electronic device are determined.

In step 430, the operating frequency of the electronic device is compared to a minimum operating frequency. If the electronic device operates at less than the minimum operating frequency, the device runs too slow to be included in the physical bin at the current operating voltage. If the minimum operating frequency is greater than or equal to the minimum operating frequency, then the process continues at step 440; otherwise the process continues at step 460.

In step 440, the operating power consumption level of the electronic device is compared to a maximum power consumption level for the physical bin. If the operating power consumption level of the electronic device is greater than the maximum power consumption level for the physical bin, then the electronic device is too leaky and consumes too much power at the current operating voltage to be included in the physical bin. If the operating power consumption level is greater than the maximum power consumption level, then the process continues at step 490. At step 490, the operating voltage of the electronic device is decreased by a voltage increment, and the process returns to step 420 to determine the operating frequency and the operating power consumption level of the electronic device. In some embodiments, the voltage increment is a predefined voltage amount. In other embodiments, the voltage increment is variable and may be adjusted to be smaller or larger. For example, the voltage increment may be adjusted to be larger in order to more quickly determine a voltage range where an electronic device performs within a set of performance requirements for a physical bin. The voltage increment may be decreased in order to determine a more precise operating voltage for the electronic device.

When the operating voltage of the electronic device is decreased, the operating power consumption level and the operating frequency of the device also decrease. Decreasing the operating voltage may lower the operating power consumption level below the maximum power consumption level for the physical bin, thereby allowing the device to operating within the performance parameters associated with the physical bin.

For those devices whose operating power consumption level is less than the maximum power consumption level for the physical bin (step 440), the process continues at step 450. At step 450, the operating voltage of the electronic devices is stored in non-volatile memory on the electronic device. For example, in an embodiment, the electronic device is a GPU, and the operating frequency of the GPU is stored on the GPU by programming a set of fuses on the GPU. The process then terminates at step 499.

For devices whose operating frequency is below the minimum operating frequency for the physical bin (step 430), the process proceeds to step 460. At step 460, the operating power consumption level is compared to the maximum power consumption level for the physical bin. If the operating power consumption level is less than the maximum power consumption level for the physical bin, then the process continues with step 470, where the operating voltage of the electronic device is increased by a predetermined increment, before proceeding to step 420 where the operating frequency and the operating power consumption level is determined for the electronic device. As with step 490, the increment at which the operating voltage is increased can be variable. If at step 460, the operating power consumption level is greater than the maximum power consumption level for the physical bin, the electronic device is assigned to a physical discard bin (step 480). Electronic devices assigned to the physical discard bin are too slow and/or consume too much power for the virtual binning process to be able to determine an operating voltage where the electronic devices operate within the operating parameters of the physical bin. For example, if an electronic device operates below the minimum operating frequency and operates at or near the maximum operating power consumption level, increasing the operating voltage may increase the operating frequency of the device to be greater than or equal to the minimum operating frequency for the physical bin, but increasing the operating voltage may also increase the operating power consumption level above the maximum power consumption level for the device. Similarly, if an electronic device has an operating power consumption level that exceeds the maximum power consumption level for the physical bin and operates at or near the minimum operating frequency for the physical bin, decreasing the operating voltage of the electronic device may decrease the operating power consumption level to be less than or equal to the maximum power consumption level of the physical bin, but decreasing the operating voltage may also decrease the operating frequency of the electronic device to below the minimum operating frequency for the physical bin. However, in some embodiments, electronic devices assigned to the discard bin may be assigned to a second physical bin with a set of operating parameters that allows lower operating frequency and/or higher operating power consumption level.

Figure 5:
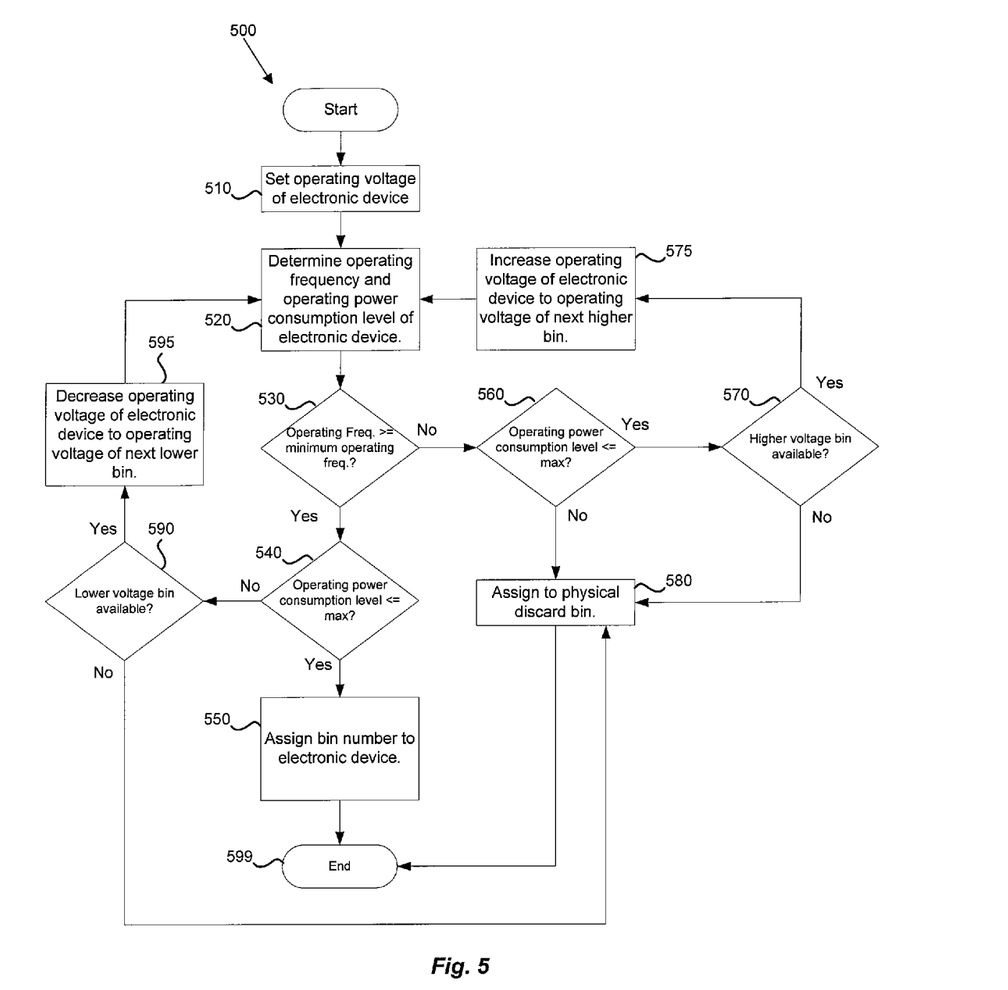
FIG. 5 is a flow diagram of a process for virtual binning of an electronic device where one or more virtual bins are associated with a physical bin and the one or more virtual bins each have an operating voltage associated with the virtual bin that allows the electronic device to be assigned to the same physical bin according to one embodiment of the present invention.

FIG. 5 is a flow diagram of a process for virtual binning of an electronic device where a set of one or more virtual bins is associated with a physical bin and each of the virtual bins has an associated operating voltage according to one embodiment of the present invention. In the present embodiment, each virtual bin has an associated operating voltage associated with the virtual bin. Electronic devices are tested to determine whether the electronic devices operate within the performance specifications for a physical bin. The performance of the electronic devices is adjusted by increasing or decreasing the operating voltage of the devices: the operating voltage is increased in order to increase the operating frequency of the devices, and the operating voltage is decreased in order to decrease the power consumption level of the devices. Accordingly, an electronic device is tested at the operating voltage associated with one or more virtual bins associated with the physical bin in an attempt to determine an operating voltage at which the electronic device operates within the performance specification defined for the physical bin.

Process 500 begins with step 510, where the system sets an operating voltage of the electronic device to an operating voltage associated with a physical bin. For example, a physical bin may have an associated operating voltage of 1.5 volts which enables an electronic device assigned to the physical bin to operate at a specified frequency and power consumption level. In alternative embodiments, the operating voltage may be set to a highest operating voltage associated with a virtual bin in the set of virtual bins associated with the physical bin. For example, obtaining the highest operating frequency possible is crucial in calculation intensive applications such as graphics processing. Therefore, the process of determining a virtual bin for an electronic device will seek a bin with the highest power consumption level for the device that still allows the device to operate within the parameters of the physical bin, because the operating frequency of the device will also be maximized. In yet other embodiments, the operating voltage may be set to a lowest operating voltage associated with a virtual bin in the set of virtual bins associated with the physical bin. For example, keeping power consumption as low as possible is crucial for mobile devices such as mobile phones and laptop computers. Therefore, the process of determining a virtual bin for an electronic device will seek a bin with the lowest power consumption level for the device that still allows the device to operate within the parameters of the physical bin.

In step 520, an operating frequency and operating power consumption level of the electronic device are determined. The operating frequency of the electronic device is compared to a minimum operating frequency in step 530. If the electronic device operates at less than the minimum operating frequency, the device runs too slow to be included in the physical bin at the current operating voltage. If the minimum operating frequency is greater than or equal to the minimum operating frequency, then the process continues at step 540, otherwise the system will continue at step 560.

In step 540, the operating power consumption level of the electronic device is compared to a maximum power consumption level for the physical bin. If the operating power consumption level of the electronic device is greater than the maximum power consumption level for the physical bin, then the electronic device is too leaky and consumes too much power at the current operating voltage to be included in the physical bin. If the operating power consumption level is greater than the maximum power consumption level, then the process continues at step 590. Otherwise, the power consumption level of the device is not greater than the maximum power consumption level associated with the physical bin and the process continues with step 550.

For those devices operating at a power consumption level that exceeds the maximum power consumption level for the physical bin (step 540), the process proceeds to step 590. In step 590, a determination is made whether the set of virtual bins that comprise the physical bin includes a virtual bin with a lower operating voltage than the current operating voltage of the electronic device. If the set of virtual bins does not include a virtual bin with an operating voltage lower than the current operating voltage of the electronic device, the electronic device is assigned to a physical discard bin (step 580). Otherwise, if there is a virtual bin with a lower operating voltage available, the process continues at step 595. In some alternative embodiments, the set of virtual bins may be expanded on the fly to include a virtual bin with an operating voltage lower than the current operating voltage of the electronic device by decrementing or incrementing the operating voltage of the electronic device by a specified amount. A new virtual bin would be added to the set of virtual bins associated with the physical bin and the new lower operating voltage of the electronic device would be associated with the virtual bin. Virtual bins may also be added on the fly where a virtual bin with a higher operating voltage does not exist in the set of virtual bins associated with the physical bin.

If a lower voltage bin is available (step 590), the process proceeds to step 595. At step 595, a virtual bin with the next higher operating voltage is selected from the subset of virtual bins that have an operating voltage associated with them that is less than the current operating voltage of the electronic device, and the operating voltage of the electronic device is set to the operating voltage associated with the virtual bin with the next highest operating voltage. The process then returns to step 520 to determine the operating frequency and the operating power consumption level of the electronic device. When the operating voltage of the electronic device is decreased, the operating power consumption level and the operating frequency of the device will also decrease. Decreasing the operating voltage may lower the operating power consumption level to allow the device to operating within the performance parameters associated with the physical bin. In some embodiments, the number of virtual bins associated with a physical bins may determine, in part, the yield of the virtual binning process. By associating a larger number of virtual bins with a physical bin, a greater number of operating voltages are provided that may allow an electronic device to operate within the specifications of the physical bin.

For those devices operating at an operating power consumption level that is less than the maximum power consumption level for the physical bin (step 540), the process proceeds to step 550. At step 550, the virtual bin number of the virtual bin is stored in a non-volatile memory on the electronic device. For example, in an embodiment, the electronic device is a GPU, and the virtual bin identifier of the virtual bin is stored on the GPU by programming a set of fuses on the GPU. The virtual bin number indicates an operating voltage at which the electronic device performs within the functional specifications of the physical bin. The process then terminates at step 599.

For those devices operating at an operating frequency that is greater than or equal to the minimum operating frequency for the physical bin (step 530), the process proceeds to step 560. In step 560, the operating power consumption level of the electronic device is compared to a maximum power consumption level for the physical bin. If the operating power consumption level of the electronic device is greater than the maximum power consumption level for the physical bin, then the electronic device is too leaky to be included in the physical bin at the current operating voltage. If the operating power consumption level is greater than the maximum power consumption level, then the process continues at step 580 where the electronic device is assigned to the physical discard bin. In this case, virtual binning cannot bring the electronic device within the operating parameters defined for the physical bin, because the electronic device is too slow and is already consuming too much power. Increasing the operating voltage of the electronic device may increase the operating frequency of the device to be above or at the minimum operating frequency threshold. However, the power consumption level of the chip already exceeds the maximum power consumption level for the physical bin, and thus, increasing the operating voltage of the electronic device may cause the power consumption of the electronic device to further exceed the performance requirements for the physical bin. Therefore, the electronic device is placed in the a physical discard bin. As discussed above, an electronic device assigned to the discard bin may be utilized for alternative uses where a slower operating frequency and/or higher power consumption levels are acceptable.

For those devices where the power consumption level of the electronic device does not exceed the maximum power consumption level associated with the physical bin (step 560), the process proceeds to step 570. At step 570, a determination is made whether the set of virtual bins that comprise the physical bin includes a virtual bin with a higher operating voltage than the current operating voltage of the electronic device. If the set of virtual bins does not include a virtual bin with an operating voltage higher than the current operating voltage of the electronic device, the electronic device is assigned to a physical discard bin (step 580).

If there is a virtual bin with a higher operating voltage available (step 570), the process proceeds to step 575. At step 575, a virtual bin with the next lower operating voltage is selected from the subset of virtual bins that have an operating voltage associated with them that is higher than the current operating voltage of the electronic device, and the operating voltage of the electronic device is set to the operating voltage associated with the virtual bin with the next lowest operating voltage. The process then returns to step 520 to determine the operating frequency and the operating power consumption level of the electronic device. When the operating voltage of the electronic device is increased, the operating power consumption level and the operating frequency of the device will also increase. Increasing the operating voltage may increase the operating frequency to fall within the performance parameters associated with the physical bin.

Figure 6:
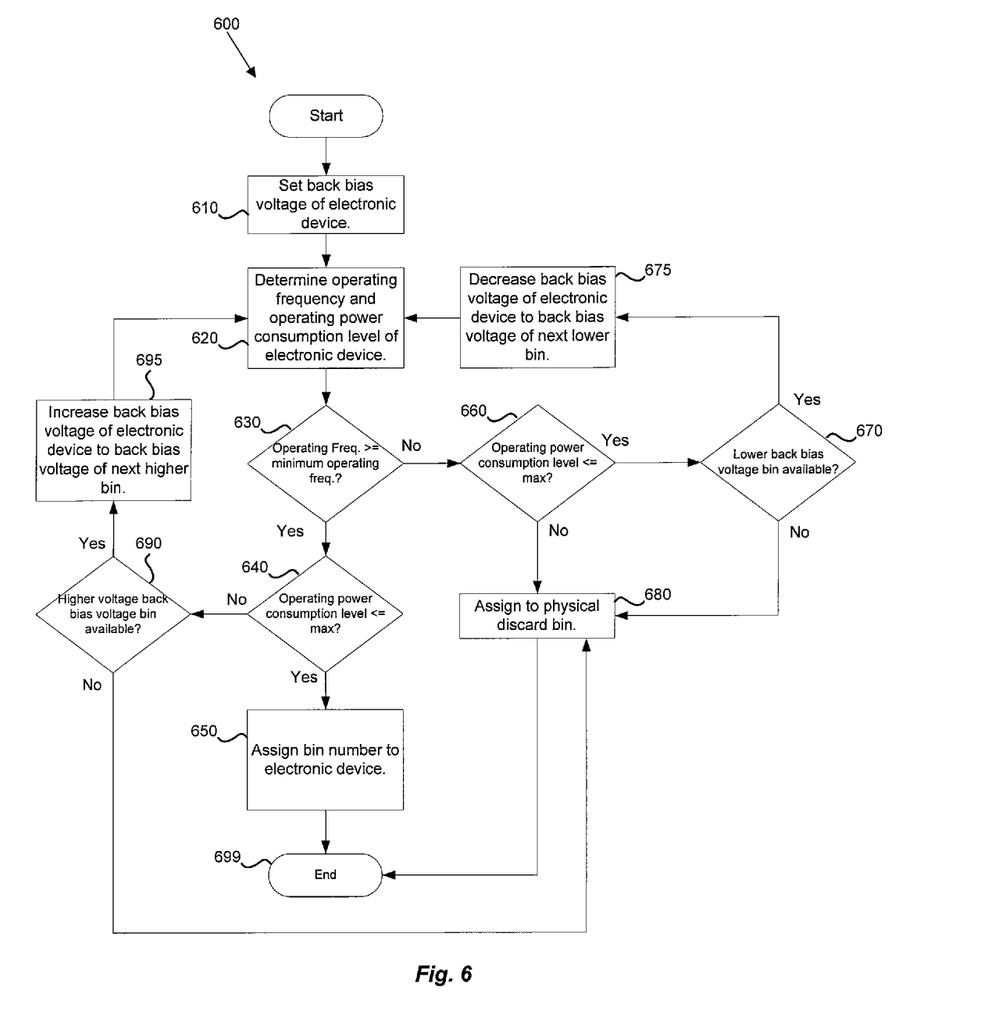
FIG. 6 is a flow diagram of a process for virtual binning of an electronic device by adjusting a back bias voltage for the electronic device according to one embodiment of the present invention.

Another way to modify the operating characteristics of a device is by modifying the back bias voltage applied to the device substrate. FIG. 6 is a flow diagram of a process for virtual binning of an electronic device where a set of one or more virtual bins is associated with a physical bin where the one more virtual bins each have a back bias voltage associated with the virtual bin and electronic devices are associated with one of the one or more virtual bins according to one embodiment of the present invention. In the present embodiment, each virtual bin has an associated back bias voltage associated with the virtual bin. The back bias voltage decreases the conductivity of transistors in the electronic device as the back bias voltage is increased, and thus, provide an alternate means for controlling the operating frequency and power consumption level of an electronic device.

Electronic devices are tested in process 600 to determine whether the electronic devices operate within the performance specifications for a physical bin. The performance of the electronic devices is adjusted by increasing or decreasing the back bias voltage of the devices: the back bias voltage is decreased in order to increase the operating frequency of the devices, and the operating voltage is increased in order to decrease the power consumption level of the devices. Accordingly, an electronic device is tested at the back bias voltage associated with one or more virtual bins associated with the physical bin in an attempt to determine a back bias voltage at which the electronic device operates within the performance specification defined for the physical bin.

The process begins with step 610, where the system sets a back bias voltage of the electronic device to an back bias voltage associated with a physical bin. For example, a physical bin may have an associated back bias voltage of 0.5 volts which enables an electronic device assigned to the physical bin to operate at a specified frequency and power consumption level. In some alternative embodiments, the set of virtual bins may be expanded on the fly to include a virtual bin with an back bias voltage higher or lower than the current back bias voltage of the electronic device by decrementing or incrementing the back bias voltage of the electronic device by a specified amount. A new virtual bin would be added to the set of virtual bins associated with the physical bin and the new back bias voltage of the electronic device would be associated with the virtual bin.

In step 620, an operating frequency and operating power consumption level of the electronic device are determined. The operating frequency of the electronic device is compared to a minimum operating frequency in step 630. If the electronic device operates at less than the minimum operating frequency, the device runs too slow at the current operating voltage to be included in the physical bin. If the minimum operating frequency is greater than or equal to the minimum operating frequency, then the process continues at step 640, otherwise the system will continue at step 660.

For devices where the operating frequency is greater than or equal to the minimum operating frequency for the physical bin (step 630), the process proceeds to step 640. In step 640, the operating power consumption level of the electronic device is compared to a maximum power consumption level for the physical bin. If the operating power consumption level of the electronic device is greater than the maximum power consumption level for the physical bin, then the electronic device is too leaky to be included in the physical bin at the current back bias voltage. If the operating power consumption level is greater than the maximum power consumption level, then the process continues at step 690. Otherwise, the power consumption level of the device is not greater than the maximum power consumption level associated with the physical bin and the process continues with step 650.

For devices where the operating power consumption level is greater the maximum power consumption level for the physical bin (step 640), the process proceeds to step 690. At step 690, a determination is made whether the set of virtual bins that comprise the physical bin includes a virtual bin with a higher back bias voltage than the current back bias voltage of the electronic device. If the set of virtual bins does not include a virtual bin with an back bias voltage higher than the current back bias voltage of the electronic device, the electronic device is assigned to a physical discard bin (step 680).

Otherwise, if the set of virtual bins includes a virtual bin with a higher back bias voltage, the process continues at step 695.

If a virtual bin with a higher back bias voltage is available (step 690), the process proceeds to step 695. At step 695, a virtual bin with the next lowest back bias voltage is selected from the subset of virtual bins that have an back bias voltage associated with them that is greater than the current back bias voltage of the electronic device, and the back bias voltage of the electronic device is set to the back bias voltage associated with the virtual bin with the next lowest back bias voltage. The process then returns to step 620 to determine the operating frequency and the operating power consumption level of the electronic device. When the back bias voltage of the electronic device is increased, the operating power consumption level and the operating frequency of the device will decrease. Increasing the back bias voltage may lower the operating power consumption level sufficiently to enable the device to operate within the performance parameters associated with the physical bin.

For devices where the operating power consumption level does not exceed the maximum power consumption level (step 640), the process proceeds to step 650. At step 650, the virtual bin number of the virtual bin associated with the back bias voltage that enables the electronic device to operate within the operating parameters for the physical bin is stored in non-volatile memory on the electronic device. For example, in an embodiment, the electronic device is a GPU, and the virtual bin identifier of the virtual bin is stored on the GPU by programming a set of fuses on the GPU. The process then terminates at step 699.

For devices where the operating frequency is less than the minimum operating frequency (step 630), the process proceeds to step 660. In step 660, the operating power consumption level of the electronic device is compared to a maximum power consumption level for the physical bin. If the power consumption level of the electronic device does not exceed the maximum power consumption level associated with the physical bin, the process continues with step 670. Otherwise, if the operating power consumption level of the electronic device exceeds the maximum power consumption level for the physical bin, the electronic device is too leaky to be included in the physical bin at the current back bias voltage and the process continues with step 680. The electronic device is assigned to the physical discard bin in step 680. In this case, virtual binning cannot bring the electronic device within the operating parameters defined for the physical bin, because the electronic device is too slow and is already consuming too much power. Decreasing the back bias voltage of the electronic device may increase the operating frequency of the device to above or at the minimum threshold. However, the power consumption level of the chip already exceeds the maximum power consumption level for the physical bin, and thus, decreasing the back bias voltage of the electronic device may cause the power consumption of the electronic device to further exceed the performance requirements for the physical bin. Therefore, the electronic device is placed in the a physical discard bin. As discussed above, an electronic device assigned to the discard bin may be utilized for alternative uses where a slower operating frequency and/or higher power consumption levels are acceptable.

For devices where the operating power consumption level does not exceed the maximum power consumption level for the physical bin (step 660), the process proceeds to step 670. At step 670, a determination is made whether the set of virtual bins that comprise the physical bin includes a virtual bin with a lower back bias voltage than the current back bias voltage of the electronic device. If the set of virtual bins does not include a virtual bin with an back bias voltage lower than the current back bias voltage of the electronic device, the electronic device is assigned to the physical discard bin (step 680). Otherwise, if there is a virtual bin with a lower back bias voltage available, the process continues at step 675.

If a virtual bin with a lower back bias voltage is available (step 670), the process proceeds to step 675. At step 675, a virtual bin with the next highest back bias voltage is selected from the subset of virtual bins that have a back bias voltage associated with them that is lower than the current back bias voltage of the electronic device, and the back bias voltage of the electronic device is set to the back bias voltage associated with the virtual bin with the next highest back bias voltage. The process then returns to step 620 to determine the operating frequency and the operating power consumption level of the electronic device. When the back bias voltage of the electronic device is decreased, the operating power consumption level and the operating frequency of the device will increase. Decreasing the back bias voltage may increase the operating frequency to fall within the performance parameters associated with the physical bin.

Another way to characterize performance of an electronic device is by work output level and functionality rather than power and frequency. Work output level of an electronic device is a measure of the amount of output an electronic device is able to produce. For example, in an embodiment, the electronic device is a graphics processing unit (GPU) and the work output level corresponds to a frame rate of the GPU. The frame rate of a GPU is a measure of how quickly the electronic device is able to produce a frame of image data (a single still image which can be part of a video stream). The frame rate may be measured in frames per second in some embodiments and measured in hertz in other embodiments. A GPU with a higher frame rate can produce frames of image data faster, and thus, would have a higher work output level than a GPU with a lower frame rate.

Functionality of an electronic device is a measure of the operability of an electronic device. For example, the functionality of an electronic device may be determined as a percentage of operable components of an electronic device compared to a total number components in the electronic device. Furthermore, in some embodiments, different components may be given different weighted values according to level of impairment to the electronic device that each component could potentially cause if the component is defective.

Figure 7:
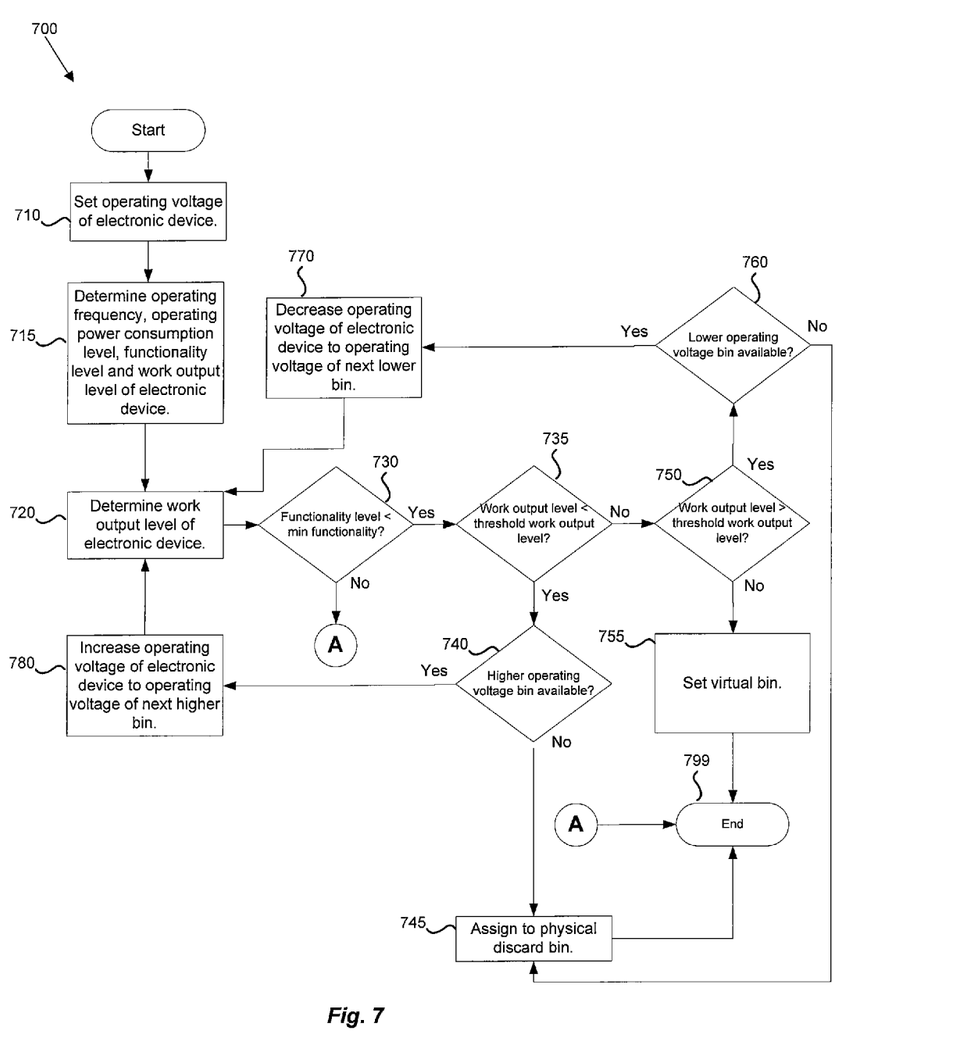
FIG. 7 is a flow diagram process for virtual binning of an electronic device where a set of one or more virtual bins is associated with a physical bin and where the one more virtual bins each have an associated work output level and functionality according to one embodiment of the present invention.

FIG. 7 is a flow diagram process 700 for virtual binning of an electronic device where a set of one or more virtual bins is associated with a physical bin and where the one more virtual bins each have a work output level and functionality associated with the virtual bin and electronic devices are associated with one of the one or more virtual bins according to one embodiment of the present invention. Process 700 illustrates a method for virtual binning of electronic devices that are not fully functional (i.e. one or more components of the electronic device are inoperable) and thus produce a lower work output level than a fully functional device, but an electronic device that is not fully functional still may be able to operate at a sufficiently high operating frequency to compensate for the lack of functionality and provide an external experience that is the same as a fully functional component.

In the present embodiment, each virtual bin has an associated operating voltage associated with the virtual bin. As described with regard to FIG. 5, electronic devices are tested to determine whether the electronic devices operate within the performance specifications for a physical bin. The performance of the electronic devices is adjusted by increasing or decreasing the operating voltage of the devices: the operating voltage is increased in order to increase the operating frequency of the devices, and the operating voltage is decreased in order to decrease the power consumption level of the devices. Accordingly, an electronic device is tested at the operating voltage associated with one or more virtual bins associated with the physical bin in an attempt to determine an operating voltage at which the electronic device operates within the performance specification defined for the physical bin. In alternate embodiments, the performance of the electronic devices is adjusted by increasing or decreasing a back bias voltage of the devices: the back bias voltage is decreased in order to increase the operating frequency of the devices, and the operating voltage is increased in order to decrease the power consumption level of the devices.

The process begins with step 710, where the system sets an operating voltage of the electronic device to an operating voltage associated with a physical bin. For example, a physical bin may have an associated operating voltage of 1.5 volts which enables an electronic device assigned to the physical bin to operate at a specified frequency and power consumption level. In alternative embodiments, a back bias voltage of the electronic device may be set in order to adjust the operating frequency and the power consumption level of the electronic device.

In step 715, an operating frequency, operating power consumption level, and a functionality level are determined. In step 720, a work output level of the electronic device are determined. The functionality level of the electronic device describes whether all of the functional components of the electronic device are operational. For example, in an embodiment, the electronic device is a GPU with eight shaders. However, due to occasional manufacturing defects, one or more of the shaders of a particular GPU do not function. Thus, the GPU may be assigned a functionality level less than 100%. For example, in the case of the six of eight shaders working, the GPU may be assigned a functionality level of 75%. The work output level of an electronic device is determined by the level of functionality of the electronic device and the operating frequency of the electronic device. Two devices with the same functionality level may have different work output levels if the devices have different operating frequencies. For example, a first electronic device has a functionality level of 100%, meaning all components are fully functional, and an operating frequency of 450 megahertz. A second electronic device has a functionality level of 100%, and an operating frequency of 400 megahertz. The second electronic device will have a lower work output level because it runs slower than the first electronic device. However, a third electronic device has a functionality level of 75%, only 6 out of 8 shaders functioning, and an operating frequency of 600 megahertz. The third electronic device has a lower functionality level than the first device, but because the third electronic device operates at a much faster operating frequency than the first electronic device, the third electronic device is still able to produce the same amount of work as the first electronic device. Thus, the work output level of the first electronic device and the third electronic device would be the same. Both the first electronic device and the third electronic device could then be placed in the same physical bin, because the external experience provided by the first and the third electronic devices would be identical since the work output levels are identical.

In step 730, a determination is made whether the functionality level of the electronic device is less than a minimum functionality threshold. In some embodiments, the minimum functionality threshold is 100%, meaning that all components of an electronic device are fully functional. If the functionality level of the electronic device is less than the minimum functionality requirement for the physical bin, then the process continues at step 735. If the functionality level of the electronic device is less not less than the minimum functionality level, the process continues to step 799 where the process terminates. However, in some embodiments, alternate virtual binning techniques may be applied in addition to virtual binning based upon functionality and work output level. For example, the virtual binning may be applied based upon operating voltage, such as in FIG. 4 and FIG. 5, or virtual binning may be applied based upon back bias voltage as described in FIG. 6. In some alternative embodiments, if the functionality level of the electronic device is greater than or equal to the minimum functionality level defined for the physical bin, the electronic device is assigned a virtual bin number associated with the current operating voltage of the electronic device and the process terminates at step 799.

For devices where the functionality level exceeds a minimum functionality level (step 730), the process proceeds to step 735. In step 735, the work output level of the electronic device is compared to a minimum work output level for the physical bin. If the work output level of the electronic device is less than the minimum work output level for the physical bin, then the process continues with step 740. Otherwise, the process continues with step 750.

For devices where the work output level is less than a threshold work output level (step 735), the process proceeds to step 740. At step 740, a determination is made whether the set of virtual bins that comprise the physical bin includes a virtual bin with a higher operating voltage than the current operating voltage of the electronic device. If the set of virtual bins does not include a virtual bin with an operating voltage higher than the current operating voltage of the electronic device, the electronic device is assigned to a physical discard bin (step 745). Otherwise, if there is a virtual bin with a higher operating voltage available, the process continues at step 780. Devices that have a lower work output level than the minimum work output level associated with the physical bin may be made to run faster by increasing the operating voltage of the electronic device. In alternative embodiments, a back bias voltage of the electronic device may be adjusted rather than or in addition to adjusting the operating voltage of the electronic device in order to increase the operating frequency and work output level of the electronic device. At step 780, a virtual bin with the next lowest operating voltage is selected from the subset of virtual bins that have an operating voltage associated with them that is higher than the current operating voltage of the electronic device, and the operating voltage of the electronic device is set to the operating voltage associated with the virtual bin with the next lowest operating voltage. The process then returns to step 720 to determine the work output level of the electronic device. When the operating voltage of the electronic device is increased, the operating frequency of the device should also increase which in turn should increase the work output level of the electronic device. Increasing the operating voltage may increase the work output level of the electronic device enough so that the device falls within the performance parameters associated with the physical bin.

For devices where the work output level is greater than or equal to the threshold work output level (step 735), the process proceeds to step 750. At step 750, a determination is made whether the work output level of the of the device is greater than a maximum work output level for the physical bin. If the work output of the electronic device is greater than a maximum work output level for the physical bin, the process continues with step 760. Otherwise, the process continues with step 755. If the work output level of the electronic device is higher than the maximum work output level for the electronic device, then the electronic device will operate faster than devices assigned to the physical bin even though the functionality of the device was below the minimum functionality for the physical bin. The operating voltage of the electronic device may be decreased in order to slow the device down to fall within the performance specifications for the physical bin. In alternative embodiments, a back bias voltage of the electronic device may be increased in order to slow down the electronic device so that the electronic device performs within the specification for the physical bin.

For devices where the work output level is greater than a threshold work output level (step 750), the process proceeds to step 760. At step 760, a determination is made whether the set of virtual bins that comprise the physical bin includes a virtual bin with a lower operating voltage than the current operating voltage of the electronic device. If the set of virtual bins does not include a virtual bin with an operating voltage lower than the current operating voltage of the electronic device, the electronic device is assigned to a physical discard bin (step 745). Otherwise, if there is a virtual bin with a lower operating voltage available, the process continues at step 770.

If a virtual bin with a lower operating voltage is available (step 760), the process proceeds to step 770. At step 770, a virtual bin with the next highest operating voltage is selected from the subset of virtual bins that have an operating voltage associated less than the current operating voltage of the electronic device, and the operating voltage of the electronic device is set to the operating voltage associated with the virtual bin with the next highest operating voltage. The process then returns to step 720 to determine the operating frequency and the operating power consumption level of the electronic device. When the operating voltage of the electronic device is decreased, the operating power consumption level and the operating frequency of the device will also decrease. Decreasing the operating voltage may lower the operating power consumption level to allow the device to operate within the performance parameters associated with the physical bin.

For devices where the work output level is not greater than a threshold work output level (step 750), the process proceeds to step 755. At step 755, the work output level of the electronic device falls within the range of the minimum work output level and the maximum work output level associated with the physical bin. The electronic device is assigned to the virtual bin associated with the current operating voltage of the electronic device. In an embodiment, the virtual bin number is stored in a non-volatile memory on the electronic device. For example, in an embodiment, the electronic device is a GPU, and the virtual bin identifier of the virtual bin is stored on the GPU by burning in into a set of fuses on the GPU. The process then terminates at step 799.

Figure 8:
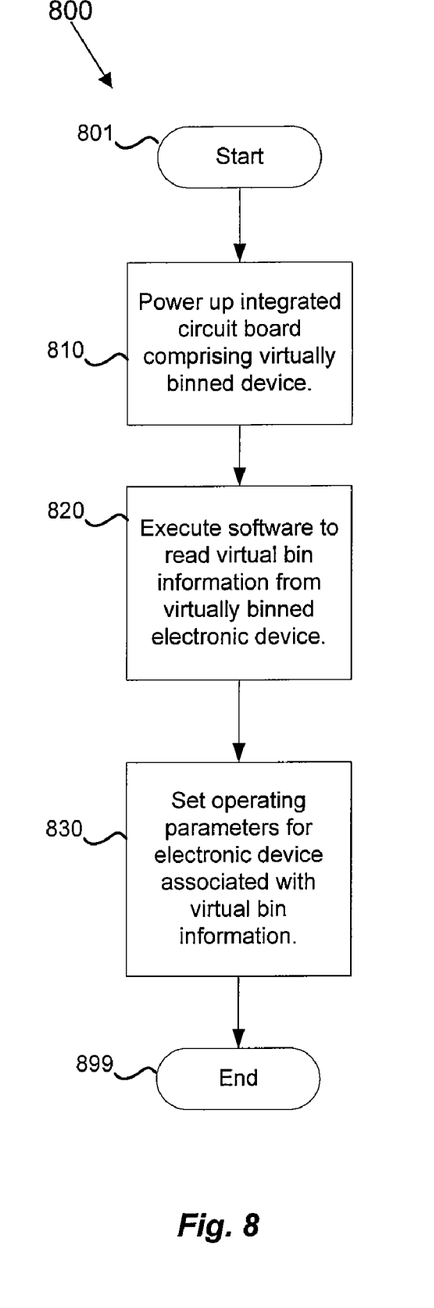
FIG. 8 is a flow diagram of a process for booting an integrated circuit board comprising a an electronic device that has been virtually binned according to one embodiment of the present invention.

The above processes result in different devices having different operating voltages. To obtain desired performance characteristics, the device should be operated at a voltage that produces those characteristics. FIG. 8 is a flow diagram of a process 800 for booting an integrated circuit board comprising an electronic device that has been virtually binned according to one embodiment of the present invention. The process begins with step 801 where an integrated circuit board includes an electronic device that has been virtually binned. In the present embodiment, the integrated circuit board provides power to the electronic device. Therefore, the electronic device is also powered down at step 801. In step 810, the integrated circuit board that includes the electronic device that has been virtually binned is powered up. For example, in an embodiment, the electronic device is a GPU with a virtual bin identifier stored thereon as described above, and the circuit board comprises a graphics card for a laptop computer or other electronic device with a display output. In step 820, the integrated circuit board executes software program code to read virtual binning information from the virtually binned electronic device. The software program code may be stored onboard the integrated circuit board in a persistent non-volatile memory, such as a read-only memory (ROM) and/or may be stored in persistent writable memory, such as a flash memory. In some embodiments, the software program code may be copied from persistent memory to volatile memory (such as a random-access memory (RAM)) prior to be being executed. In some embodiments, the virtual bin information is programmed onto a virtually binned electronic device by burning it into a set of fuses included in the electronic device. The software program code reads the programmed virtual bin information to determine the operating parameters for the virtually binned electronic device.

In step 830, operating parameters for the virtually binned advice are set based upon the virtual bin information read from the virtually binned electronic device. As described above in the various embodiments of the present invention, the operating parameters for the electronic device may include an operating voltage and/or a back bin voltage at which the electronic device will operate within the predefined operating parameters of a physical bin. In some embodiments, the virtual bin information comprises an operating voltage and/or a back bias voltage for the electronic device. In alternative embodiments, the virtual bin information comprises a virtual bin identifier that the software program code located on an integrated circuit device translates into an appropriate operating voltage and/or back bias voltage. The process ends with step 899.

What is claimed is:

1. A method for determining a virtual bin for an electronic device to enable the electronic device to perform with a set of operating parameters of a physical bin, the method comprising:
    setting an operating voltage of the electronic device to a first voltage;
    determining an operating frequency and an operating power consumption level of the electronic device after setting the operating voltage;
    determining an operating frequency differential, wherein the operating frequency differential represents the difference between the operating frequency and a minimum operating frequency of the physical bin;
    determining a power consumption level differential, wherein the power consumption differential represents the difference between the operating power consumption level and a maximum operating power consumption level of the physical bin;
    assigning a virtual bin identifier to the electronic device to identify the operating voltage of the electronic device if the operating frequency is greater than or equal to the minimum operating frequency of the physical bin and the operating power consumption level is less than or equal to the maximum power consumption level of the physical bin;
    setting a back bias voltage of the electronic device to a second voltage; and
    assigning a non-volatile bin number to the electronic device to identify the back bias voltage alone or in conjunction with identifying the operating voltage of the electronic device if the operating frequency is greater than or equal to the minimum operating frequency of the physical bin and the operating power consumption level is less than or equal to the maximum power consumption level of the physical bin, wherein in the event that the operating power consumption level exceeds the maximum power consumption level of the physical bin, the method further comprises:

determining the back bias voltage such that the operating power consumption level is less than or equal to the maximum power consumption level of the physical bin, wherein the determining a back bias voltage comprises the steps of:

incrementally increasing the back bias voltage of the electronic device by a voltage increment and redetermining the operating power consumption level and the operating frequency of the electronic device while the operating power consumption level is greater than the maximum power consumption level of the physical bin and the operating frequency is greater than or equal to the minimum operating frequency of the physical bin; and assigning a non-volatile bin number to the electronic component to identify the back bias voltage of the electronic component if the operating frequency is greater than or equal to the minimum operating frequency of the physical bin and the operating power consumption level is less than or equal to the maximum power consumption level of the physical bin.

2. The method of claim 1 wherein assigning the virtual bin identifier includes:

programming a set of fuses in the electronic device to store the virtual bin identifier that can be read to identify an operating voltage at which the electronic device will perform within the operating parameters of the physical bin.

3. The method of claim 1 wherein in the event that the operating frequency is less than the minimum operating frequency of the physical bin, the method further comprises:

determining the back bias voltage such that the operating frequency is greater than or equal to the minimum operating frequency of the physical bin wherein the determining a back bias voltage comprises the steps of:

incrementally decreasing the back bias voltage of the electronic device by a voltage increment and redetermining the operating frequency and the operating power consumption level of the electronic device while the operating frequency is less than the minimum operating frequency of the physical bin and the operating power consumption level is less than or equal to the maximum power consumption level of the physical bin; and assigning a non-volatile bin number to the electronic component to identify the back bias voltage of the electronic component if the operating frequency is greater than or equal to the minimum operating frequency of the physical bin and the operating power consumption level is less than or equal to the maximum power consumption level of the physical bin.

4. The method of claim 1 further comprising:

mounting the electronic device on a printed circuit board; reading the non-volatile bin number of the electronic device; and setting one or more operating parameters of the electronic device based upon the non-volatile bin number of the electronic device.

5. The method of claim 1 wherein assigning the virtual bin identifier includes:

programming a set of fuses in the electronic device to store the virtual bin identifier that can be read.

6. The method of claim 1 further comprising:

mounting the electronic device on a printed circuit board; reading the non-volatile bin number of the electronic device; and setting one or more operating parameters of the electronic device based upon the non-volatile bin number of the electronic device.

7. A method for virtual binning of an electronic device comprising:

iteratively performing the following steps for each virtual bin in a set of virtual bins associated with a physical bin to determine a virtual bin identifier for the electronic device:

selecting a selected virtual bin from a set of virtual bins associated with a physical bin, wherein the selected virtual bin comprises a virtual bin identifier and one or more operating parameters;

setting one or more operating parameters for the electronic device to the one or more operating parameters for the electronic device of the selected virtual bin;

determining an operating frequency and an operating power consumption level for the electronic device;

determining an operating frequency differential, wherein the operating frequency differential represents the difference between the operating frequency and a minimum operating frequency of the physical bin;

determining a power consumption level differential, wherein the power consumption differential represents the difference between the operating power consumption level and a maximum operating power consumption level of the physical bin;

assigning the virtual bin identifier of the selected virtual bin to the electronic device if the power consumption differential is less than a power consumption differential threshold of the physical bin and the operating frequency differential is less than a operating frequency differential threshold for the physical bin; and stopping the iteration through the set of virtual bins associated with the physical bin if a virtual bin identifier is assigned to the electronic device, wherein the selected virtual bin further comprises a virtual bin back bias voltage, and further comprising:

setting a back bias voltage of the electronic device to the virtual bin back bias voltage of the selected virtual bin;

setting an operating voltage of the electronic device to an operating voltage associated with the physical bin; and determining an operating frequency and an operating power consumption level for the electronic device after setting the back bias voltage of the electronic device.

8. The method of claim 7 further comprising:

assigning the electronic device to a physical discard bin if no virtual bin identifier was assigned to the electronic device after iterating through the set of virtual bins associated with the physical bin.

9. The method of claim 7 wherein the assigning of the virtual bin number to the electronic device further comprises:

programming a set of fuses in the electronic device to store the virtual bin number assigned to the electronic device.

10. A method for virtual binning of an electronic device comprising:

iteratively performing the following steps for each virtual bin in a set of virtual bins associated with a physical bin to determine a virtual bin identifier for the electronic device:

selecting a selected virtual bin from a set of virtual bins associated with a physical bin, wherein the selected virtual bin comprises a virtual bin identifier and one or more operating parameters;

setting one or more operating parameters for the electronic device to the one or more operating parameters for the electronic device of the selected virtual bin;

determining an operating frequency and an operating power consumption level for the electronic device;

determining an operating frequency differential, wherein the operating frequency differential represents the difference between the operating frequency and a minimum operating frequency of the physical bin;

determining a power consumption level differential, wherein the power consumption differential represents the difference between the operating power consumption level and a maximum operating power consumption level of the physical bin;

assigning the virtual bin identifier of the selected virtual bin to the electronic device if the power consumption differential is less than a power consumption differential threshold of the physical bin and the operating frequency differential is less than a operating frequency differential threshold for the physical bin; and stopping the iteration through the set of virtual bins associated with the physical bin if a virtual bin identifier is assigned to the electronic device;

determining a functionality level and a work output level of the electronic device;

determining a functionality level differential, wherein the functionality level differential comprises the difference between a functionality level of the electronic device and a minimum functionality level for the physical bin;

determining a work output level differential, wherein the work output level differential comprises the difference between the work output level of the electronic device and the minimum work output level of the physical bin; and assigning the virtual bin identifier of the selected virtual bin to the electronic device if the functionality differential is greater than a functionality differential threshold for the physical bin and the work level differential is less than a work level differential for the physical bin wherein the selected virtual bin further comprises a virtual bin back bias voltage, the method further comprising:

setting a back bias voltage of the electronic device to the virtual bin back bias voltage of the selected virtual bin;

setting an operating voltage of the electronic device to an operating voltage associated with the physical bin; and determining an operating frequency and an operating power consumption level for the electronic device after setting the back bias voltage.

11. The method of claim 10 further comprising:

assigning the electronic device to a physical discard bin if no virtual bin identifier was assigned to the electronic device after iterating through the set of virtual bins associated with the physical bin.

12. The method of claim 10 wherein the assigning of the virtual bin number to the electronic device further comprises:

programming a set of fuses in the electronic device to store the virtual bin number assigned to the electronic device.

13. A system for utilizing a virtually-binned electronic device comprising:

an electronic device comprising a virtual bin identifier identifying a virtual bin to which the electronic device has been assigned from a set of virtual bins associated with a physical bin;

a integrated circuit board wherein the electronic device is coupled to the integrated circuit board; and software code adapted to read the virtual bin identifier from the electronic device, to determine one or more operating parameters for the electronic device, and to configure the integrated circuit board to provide the one more operating parameters to the electronic device, wherein the one or more operating parameters for the electronic device comprises:

a back bias voltage associated with the non-volatile virtual bin identifier; and wherein the software code is adapted to configure the integrated circuit board to provide the electronic device with the back bias voltage associated with the non-volatile virtual bin identifier.

14. The system of claim 13 wherein the non-volatile virtual bin identifier of the electronic device is programmed into a set of fuses in the electronic device.

15. The system of claim 13 wherein the one or more operating parameters for the electronic device comprises:

an operating voltage associated with the non-volatile virtual bin identifier; and wherein the software code is adapted to configure the integrated circuit board to provide the electronic device with the operating voltage associated with the non-volatile virtual bin identifier.

* * * * *